US012738472B2

(12) United States Patent
Miyazaki et al.

(10) Patent No.: US 12,738,472 B2
(45) Date of Patent: Sep. 15, 2026

(54) TIME-OF-FLIGHT MASS SPECTROMETER AND TIME-OF-FLIGHT MASS SPECTROMETRY METHOD

(71) Applicant: Shimadzu Corporation, Kyoto (JP)

(72) Inventors: Yuta Miyazaki, Kyoto (JP); Tomoyuki Oshiro, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 364 days.

(21) Appl. No.: 18/559,166

(22) PCT Filed: Jun. 9, 2021

(86) PCT No.: PCT/JP2021/021874
§ 371 (c)(1),
(2) Date: Nov. 6, 2023

(87) PCT Pub. No.: WO2022/259405
PCT Pub. Date: Dec. 15, 2022

(65) Prior Publication Data
US 2024/0242957 A1 Jul. 18, 2024

(51) Int. Cl.
*H01J 49/40* (2006.01)
*G01R 19/00* (2006.01)

(52) U.S. Cl.
CPC .......... *H01J 49/40* (2013.01); *G01R 19/0084* (2013.01)

(58) Field of Classification Search
None
See application file for complete search history.

(56) References Cited

U.S. PATENT DOCUMENTS 5,886,345 A * 3/1999 Koster .................... H01J 49/40 250/252.1
5,969,348 A * 10/1999 Franzen ................ H01J 49/403 250/282
(Continued)

FOREIGN PATENT DOCUMENTS

JP H10106484 A * 4/1998
JP 2009277376 A * 11/2009
(Continued)

OTHER PUBLICATIONS

English machine translation for JP-H10106484-A (Year: 1998).*
(Continued)

*Primary Examiner* — David E Smith
*Assistant Examiner* — Alina Kaliszewski
(74) *Attorney, Agent, or Firm* — Muir Patent Law, PLLC

(57) ABSTRACT

A TOFMS includes flight space formation electrodes, an ion detection unit, voltage switching units to switch a voltage to be applied to the flight space formation electrode from a first voltage for flying ions of a first polarity to a second voltage for flying ions of a second polarity, ion information acquisition units to obtain a time of flight or a m/z of the ions based on a detection result of the ions of the second polarity after the voltage has been switched, a correction information storage unit to store correction information related to a deviation in time of flight or a m/z associated with an elapsed time from the switching timing, and a correction unit to correct the flight time or the m/z according to an elapsed time from the switching timing when the detection result of the ion is obtained using the correction information.

18 Claims, 8 Drawing Sheets

(56) References Cited

U.S. PATENT DOCUMENTS

| | | | | |
|---|---|---|---|---|
| 6,384,410 | B1 * | 5/2002 | Kawato | H01J 49/405 250/281 |
| 8,907,274 | B2 * | 12/2014 | Mizutani | H01J 49/421 250/281 |
| 9,082,602 | B2 | 7/2015 | Shchepunov et al. | |
| 10,475,635 | B2 | 11/2019 | Oshiro | |
| 10,741,376 | B2 * | 8/2020 | Hoyes | H01J 49/426 |
| 2003/0071210 | A1 | 4/2003 | Kawato | |
| 2003/0102429 | A1 * | 6/2003 | Kawato | H01J 49/40 250/287 |
| 2005/0092913 | A1 * | 5/2005 | Ishihara | H01J 49/408 250/287 |
| 2006/0219890 | A1 * | 10/2006 | Yamaguchi | H01J 49/0036 250/287 |
| 2008/0006768 | A1 * | 1/2008 | Yamaguchi | H01J 49/408 250/287 |
| 2008/0277580 | A1 * | 11/2008 | Takeshita | H01J 49/42 250/292 |
| 2009/0230297 | A1 * | 9/2009 | Mizutani | H02M 7/103 250/281 |
| 2010/0096543 | A1 * | 4/2010 | Kenny | H01J 49/401 250/282 |
| 2010/0176292 | A1 * | 7/2010 | Yamauchi | H01J 49/40 250/287 |
| 2011/0215238 | A1 * | 9/2011 | Kajihara | H01J 49/0009 250/282 |
| 2012/0074303 | A1 * | 3/2012 | Rather | H01J 49/0009 250/252.1 |
| 2012/0175514 | A1 * | 7/2012 | Izumi | H01J 43/30 250/281 |
| 2016/0071711 | A1 * | 3/2016 | Ikegami | H01J 49/0036 250/281 |
| 2017/0067865 | A1 * | 3/2017 | Shimomura | G01N 30/8631 |
| 2017/0271135 | A1 * | 9/2017 | Yamaguchi | H01J 49/26 |
| 2017/0352525 | A1 * | 12/2017 | Ikegami | G06F 18/15 |
| 2018/0012740 | A1 * | 1/2018 | Shimomura | H01J 49/0409 |
| 2018/0284065 | A1 * | 10/2018 | Yamamoto | H01J 49/005 |
| 2019/0006168 | A1 * | 1/2019 | Mizutani | H01J 49/10 |
| 2019/0088460 | A1 * | 3/2019 | Oshiro | H01J 49/067 |
| 2019/0170688 | A1 * | 6/2019 | Ikeda | H01J 49/0031 |
| 2019/0311893 | A1 | 10/2019 | Aoki | |
| 2020/0319147 | A1 * | 10/2020 | Sawata | G01N 30/86 |

FOREIGN PATENT DOCUMENTS

| | | | | | |
|---|---|---|---|---|---|
| JP | 2011096542 | A | * | 5/2011 | |
| JP | 2015072775 | A | * | 4/2015 | |
| JP | 5915760 | B2 | | 5/2016 | |
| JP | 6485590 | B2 | | 3/2019 | |
| JP | 6596103 | B2 | | 10/2019 | |
| JP | 2020-194648 | A | | 12/2020 | |
| WO | WO-2010023706 | A1 | * | 3/2010 | H01J 49/4215 |
| WO | 2018/066064 | A1 | | 4/2018 | |
| WO | WO-2019150576 | A1 | * | 8/2019 | G01N 27/623 |

OTHER PUBLICATIONS

English machine translation for JP-2009277376-A (Year: 2009).*

English machine translation for WO-2010023706-A1 (Year: 2010).*

Q factor (quality factor). (2014). In M. Clugston, The Penguin Dictionary of Science (4th ed.). https://access.infobase.com/article/2742795-q-factor-quality-factor?aid=279753 (Year: 2014).*

English machine translation for JP-2011096542-A (Year: 2011).*

English machine translation for JP-2015072775-A (Year: 2015).*

English machine translation for WO-2019150576-A1 (Year: 2019).*

Written Opinion of the International Searching Authority (ISA237) dated Aug. 2, 2021, for PCT application No. PCT/JP2021/021874.

Extended European Search Report dated Aug. 28, 2024 issued for the corresponding European Patent Application No. 21945082.2.

Watson et al., "Introduction to mass spectrometry: instrumentation, applications, and strategies for data interpretation," John Wiley & Sons, 2007.

First Office Action dated Apr. 13, 2026 issued for the corresponding Chinese Patent Application No. 202180097666.1.

First Office Action dated Apr. 14, 2026 issued for the corresponding European Patent Application No. 21945082.2.

* cited by examiner

SAMPLE LIQUID
501
500
50
502
51
511
512
52
521
53
531
533
532
534
C1
540
541
545
5
543
544
C2
54
542
VACUUM EXHAUST
COLLISION GAS
VACUUM EXHAUST
POWER SUPPLY UNIT
2
CONTROL UNIT
4
3
DATA PROCESSING UNIT
30
TIME-OF-FLIGHT DATA ACQUISITION UNIT
31
CORRECTION INFORMATION STORAGE UNIT
32
m/z VALUE CALCULATOR
33
m/z VALUE CORRECTION UNIT
34
MASS SPECTRUM CREATION UNIT

*(reproduced from FIG. 4B of JP 5,915,760 B)*

*(reproduced from FIG. 1 of JP 6,596,103 B)*

TIME-OF-FLIGHT MASS SPECTROMETER AND TIME-OF-FLIGHT MASS SPECTROMETRY METHOD

TECHNICAL FIELD

The present invention relates to a time-of-flight mass spectrometer (hereinafter may be abbreviated as "TOFMS").

BACKGROUND ART

Some compounds are likely to be positive ions while others are likely to be negative ions. Therefore, when an unknown compound in a sample is analyzed using a mass spectrometer or when a wide variety of compounds in a sample are analyzed, it is necessary to perform analysis while switching between positive ion measurement and negative ion measurement. In the mass spectrometer, the polarity of an ion to be measured is switched by switching the polarity of a voltage applied to each unit such as an ion source, an ion transport optical system, a mass separator, and an ion detector.

In a TOFMS using a time-of-flight mass separator as a mass separator, a high-voltage power supply is used to apply a high voltage of several kV to several tens of kV to a flight tube, an ion reflector, and the like included in the mass separator. In order to realize high mass accuracy in TOFMS, high accuracy (accuracy of several ppm in general) is required for the output voltage of the high-voltage power supply (see Patent Literature 1 or the like). In a general high-voltage power supply, when the polarity of a high voltage to be output is switched, it takes time until the voltage is stabilized in a state of high accuracy as described above. Therefore, when the polarity of an ion to be measured is switched in TOFMS, it is necessary to secure a waiting time until each voltage is sufficiently stabilized after the polarity of the plurality of high-voltage power supplies is switched, and in general TOFMS, the voltage stabilization waiting time is about several seconds.

CITATION LIST

Patent Literature

Patent Literature 1: WO 2018/066064 A
Patent Literature 2: JP 6485590 B2
Patent Literature 3: JP 5915760 B2
Patent Literature 4: JP 6596103 B2

SUMMARY OF INVENTION

Technical Problem

That is, in TOFMS, sufficient mass accuracy cannot be obtained unless measurement is performed and data is acquired after a sufficient waiting time of about several seconds or more is secured at the time of switching between positive ion measurement and negative ion measurement. In other words, in order to realize high mass accuracy in TOFMS, it is necessary to provide a sufficient waiting time at the time of switching the polarity of an ion to be measured, and there is the problem that it is difficult to measure ions of both positive and negative polarities while switching the polarity at high speed.

The present invention has been made to solve such a problem, and the main object is to provide a time-of-flight mass spectrometer and a time-of-flight mass spectrometry method capable of shortening a waiting time after polarity switching of an ion to be measured while ensuring high mass accuracy.

Solution to Problem

A mode of a time-of-flight mass spectrometer according to the present invention made to solve the above problems includes:

a flight space formation electrode configured to form a flight space for separating ions derived from a component contained in a sample according to a mass-to-charge ratio;

an ion detection unit configured to detect ions that have flown in the flight space;

a voltage switching unit configured to switch a voltage to be applied to the flight space formation electrode from a first voltage for flying ions of a first polarity to a second voltage for flying ions of a second polarity at a given switching timing;

an ion information acquisition unit configured to obtain a time of flight during which the ion flies in the flight space or a mass-to-charge ratio of the ion based on a detection result of the ions of the second polarity obtained by the ion detection unit after the voltage has been switched by the voltage switching unit;

a correction information storage unit configured to store correction information related to a deviation in time of flight or a mass-to-charge ratio associated with an elapsed time from the switching timing; and a correction unit configured to correct the flight time or the mass-to-charge ratio obtained by the ion information acquisition unit according to an elapsed time from the switching timing when the detection result of the ion is obtained using the correction information stored in the correction information storage unit.

In addition, a mode of a time-of-flight mass spectrometry method according to the present invention made to solve the above problems includes:

a voltage switching step of switching a voltage to be applied to a flight space formation electrode which is configured to form a flight space for separating ions derived from a component contained in a sample according to a mass-to-charge ratio, from a first voltage for flying ions of a first polarity to a second voltage for flying ions of a second polarity at a given switching timing;

an ion information acquisition step of obtaining a time of flight during which the ions fly in the flight space or a mass-to-charge ratio of the ions based on a detection result of the ions of the second polarity obtained by an ion detection unit which is configured to detect ions that have flown in the flight space after the voltage has been switched by the voltage switching step; and a correction step of correcting the flight time or the mass-to-charge ratio obtained in the ion information acquisition step according to an elapsed time from the switching timing when the detection result of the ion is obtained using correction information in which an elapsed time from the switching timing is associated with information on a deviation in the flight time or the mass-to-charge ratio.

Advantageous Effects of Invention

In the time-of-flight mass spectrometer and the time-of-flight mass spectrometry method according to the above modes of the present invention, even while the voltage applied to the flight space formation electrode is not yet sufficiently stable, that is, even while the voltage fluctuates from the time point when the voltage to be applied to the flight space formation electrode is switched to switch the polarity of an ion to be measured, the time-of-flight or the mass-to-charge ratio with high accuracy can be obtained by correcting the deviation of the time-of-flight or the mass-to-charge ratio due to the fluctuation. Therefore, according to the time-of-flight mass spectrometer and the time-of-flight mass spectrometry method according to the above modes of the present invention, it is possible to shorten the waiting time for measurement after switching the polarity of an ion to be measured while ensuring high mass accuracy. Accordingly, for example, it is possible to continuously perform measurement while switching positive and negative ions at high speed.

In addition, according to the time-of-flight mass spectrometer and the time-of-flight mass spectrometry method according to the above mode of the present invention, even a power supply having an unsatisfactory response characteristic (rising characteristic of voltage) that has been difficult to adopt so far, for example, a power supply that causes ringing after the voltage approaches a target value, can be adopted as a power supply for applying a voltage to the flight space formation electrode. As a result, it is possible to select a more inexpensive power source, and it is possible to reduce the cost of the device.

DESCRIPTION OF EMBODIMENTS

[Principle of Elimination of Mass Deviation at Time of Polarity Switching]

Figure 2:
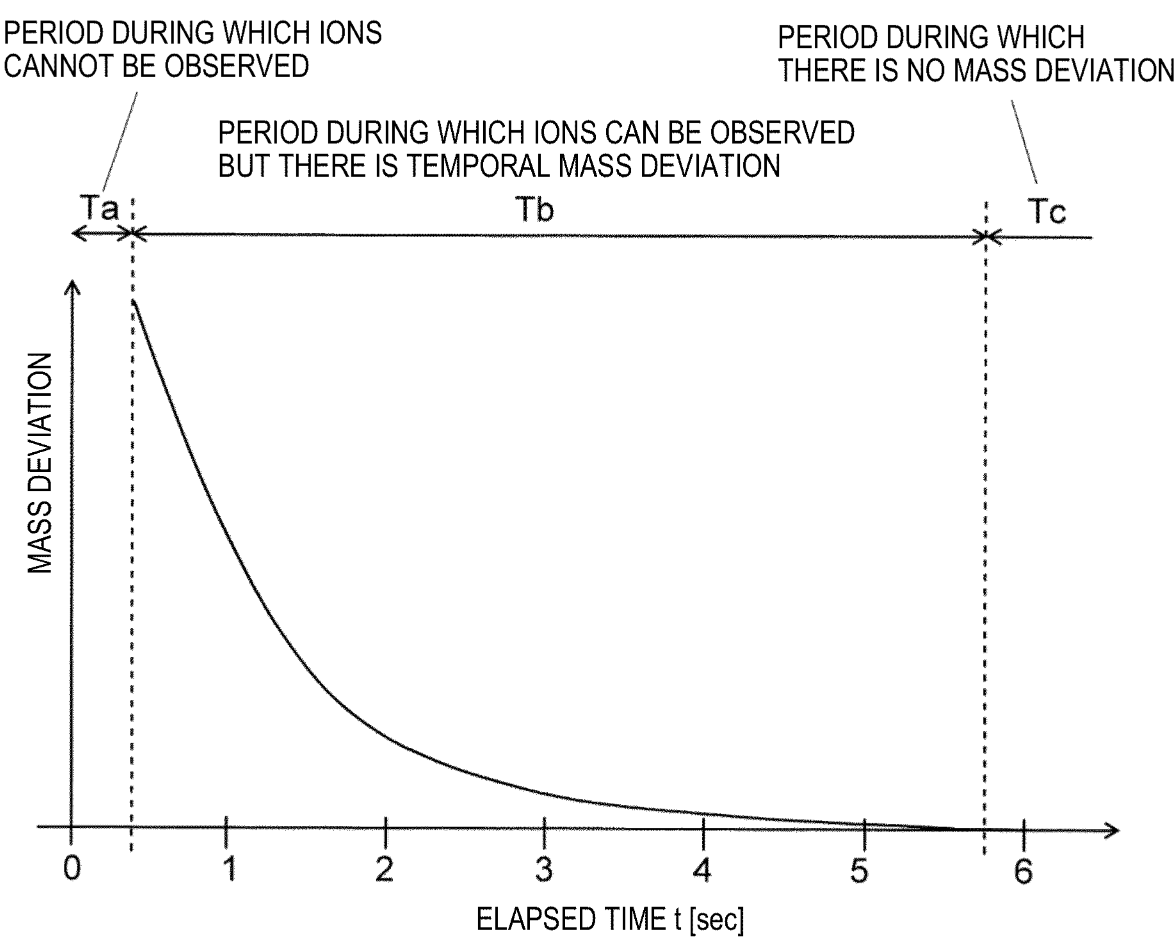
FIG. 2 is a diagram illustrating an example of a relationship between an elapsed time from polarity switching of a power supply unit and a mass deviation.

FIG. 2 is a diagram illustrating an example of a temporal change in a deviation (mass deviation) of a mass-to-charge ratio (strictly speaking, it is "m/z" in italics, but it is described as "mass-to-charge ratio" or "m/z" here) after polarity switching of an ion to be measured in a general TOFMS. The mass deviation is an error (deviation from an ideal value) of the m/z value of the ion peak derived from a certain component on the mass spectrum.

As illustrated in FIG. 2, during a predetermined time Ta (in this example, about 0.4 seconds) from the time point (elapsed time t=0) when the polarity of the voltage of the power supply unit that applies the voltage to the electrode included in the TOFMS is switched in order to switch the polarity of an ion to be measured, the power supply voltage is greatly deviated from the target value, so that the ion does not converge, and no ion peak is observed. Thereafter, when the power supply voltage approaches the target value, the ions generally converge, so that an ion peak is observed. However, since the output voltage of the high-voltage power supply is not yet sufficiently stable for a certain time Tb, the m/z value of the ion peak deviates, and the deviation decreases with the lapse of time. Then, in a period Tc after a lapse of a predetermined time (about 5.7 seconds in this example), the output voltage of the high-voltage power supply is stabilized and there is no mass deviation.

TOFMS is generally required to measure m/z values with high accuracy. Therefore, normally, after the polarity of the voltage is switched, the acquisition of the spectrum data is started after waiting until there is no shift of the m/z value, that is, after the Tc period. When the acquisition of the spectrum data is started during the Tb period, the waiting time after the polarity switching of the voltage can be shortened, but since the power supply voltage is unstable, the m/z value of the observed ion peak deviates from the ideal value, and high mass accuracy cannot be realized.

In contrast, in the TOFMS of the above mode according to the present invention, the information related to the mass deviation during the Tb period is stored as correction information associated with the elapsed time from the voltage switching timing (t=0), and the deviation of the flight time or the m/z value of each ion obtained from the actual measurement data is corrected using the correction information. Consequently, even if the measurement is performed during the Tb period, a m/z value with high accuracy is obtained.

Here, the "correction information related to a deviation in time of flight or a mass-to-charge ratio" may be any information that can be used to correct the mass deviation caused by the voltage fluctuation, and for example, may be the deviation amount itself of the flight time or the m/z value, or may be a correction coefficient for correcting the mass deviation. In addition, the association with the elapsed time may be a function (calculation formula) using the elapsed time as one variable or a data table using the elapsed time as one input.

In addition, in the TOFMS, a flight time is obtained by measurement, and calculation for converting the flight time into an m/z value is performed. Therefore, after obtaining the m/z value regarded that there is no mass deviation due to the fluctuation of the power supply voltage (that is, the m/z value when it is assumed to be obtained in the Tc period), correction calculation processing may be performed on the m/z value, but the m/z value after correction can be directly calculated from the value of the time of flight regarded that there is no mass deviation due to the fluctuation of the power supply voltage. That is, in the TOFMS of the above mode, the "ion information acquisition unit" and the "correction unit" do not perform the respective processing or operations in order, but can perform the processing or operations having different technical meanings substantially simultaneously.

[Configuration and Operation of TOFMS of One Embodiment]

Hereinafter, an embodiment of a TOFMS according to the present invention based on the above principle will be described with reference to the accompanying drawings.

Figure 1:
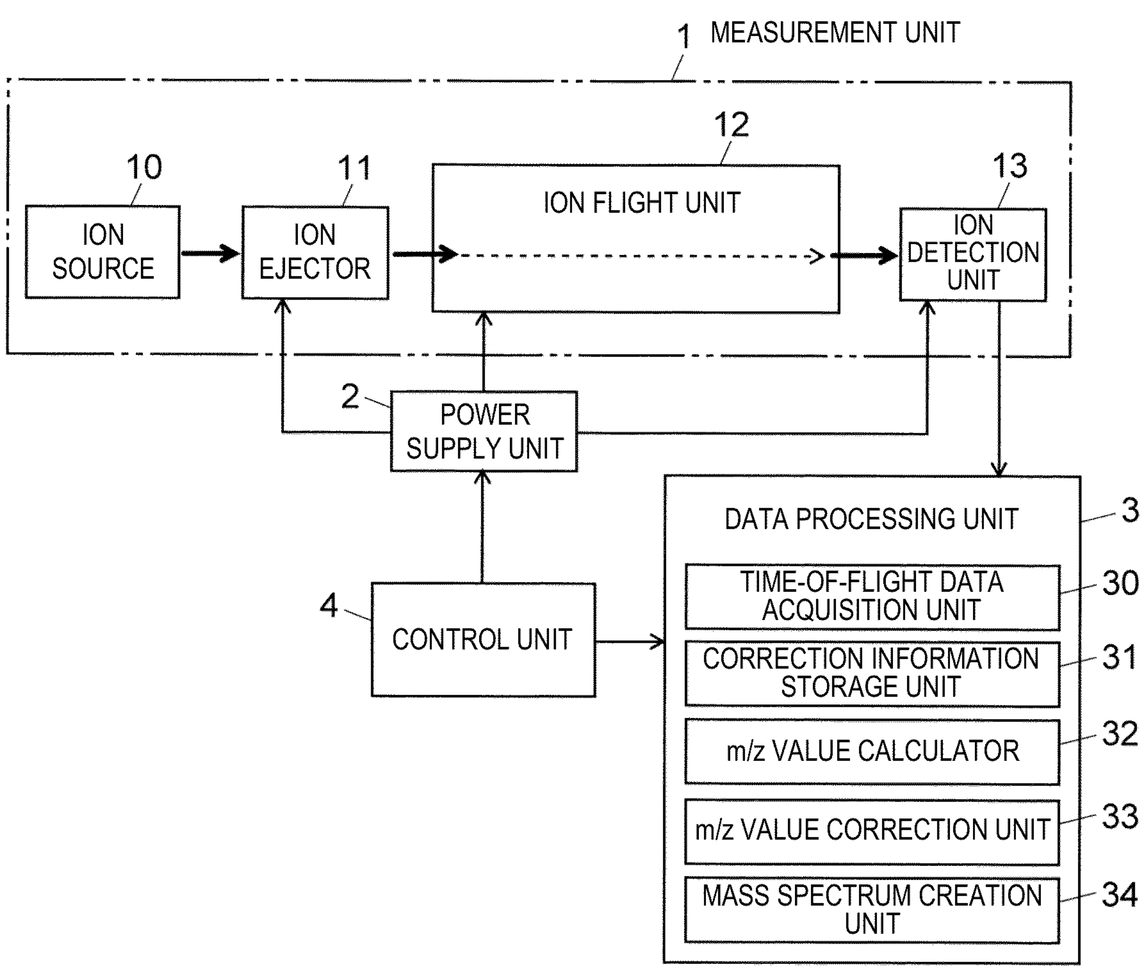
FIG. 1 is a schematic configuration diagram of a TOFMS as one embodiment of the present invention.

FIG. 1 is a schematic configuration diagram of a mode of a TOFMS according to the present invention.

The TOFMS includes a measurement unit 1, a power supply unit 2, a data processing unit 3, and a control unit 4. The measurement unit 1 includes an ion source 10, an ion ejector 11, an ion flight unit 12, and an ion detection unit 13. The specific configuration of the measurement unit 1 varies depending on the type of the time-of-flight mass separator, and some specific examples of the specific configuration will be described later. The data processing unit 3 includes, as functional blocks, a time-of-flight data acquisition unit 30, a correction information storage unit 31, an m/z value calculator 32, an m/z value correction unit 33, and a mass spectrum creation unit 34.

For example, the data processing unit 3 and the control unit 4 can realize the functions of the above units by using a personal computer as a hardware resource and executing dedicated software installed in the computer by the computer. Of course, a part of the data processing unit 3 and the control unit 4 can be configured by a hardware circuit.

The operation of the TOFMS of the present embodiment is as follows.

The power supply unit 2 applies a predetermined voltage to each unit of the measurement unit 1 under the control of the control unit 4. In the measurement unit 1, the ion source 10 ionizes components contained in the introduced sample. The ion ejector 11 applies energy to ions derived from the sample component at an appropriate timing, emits the ions, and introduces the ions into the ion flight unit 12. The "ions derived from the sample component" as used herein are not necessarily ions generated by the ion source 10, and include ions generated by a dissociation operation or the like on the ions.

The ion flight unit 12 includes one or more electrodes, and forms a flight space through which ions pass by using an electric field generated by a voltage applied to the electrodes. The ions ejected from the ion ejector 11 fly in the flight space and reach the ion detection unit 13. The flight speed of the ion introduced into the ion flight unit 12 depends on the m/z value of the ion. Therefore, the flight time from when the ions leave the ion ejector 11 to when the ions reach the ion detection unit 13 depends on the m/z value of the ions. That is, ions having various m/z values that have been substantially simultaneously emitted from the ion ejector 11 reach the ion detection unit 13 with a time difference corresponding to the m/z value. The ion detection unit 13 detects arriving ions and outputs an ionic intensity signal corresponding to the amount of the ions with the lapse of time.

In the data processing unit 3, the time-of-flight data acquisition unit 30 converts the ionic intensity signal into digital data, and stores time-of-flight spectrum data indicating the relationship between the time-of-flight with the ion emission time point set to zero and the ionic intensity. As described above, the flight time of the ion depends on the m/z value of the ion. Therefore, the m/z value can be obtained from the flight time for each ion species using a conversion formula indicating the relationship between the flight time and the m/z value. Here, the conversion formula (function) is f.

That is, in the conventional general TOFMS, the m/z value is calculated from a flight time ttof using the predetermined conversion formula f as shown in Formula (1). The conversion formula f can be obtained in advance, or the conversion formula f can be derived from the result of measurement using a standard sample whose precise m/z value is known.

$$m/z=f(ttof) \tag{1}$$

The conversion formula f in the above Formula (1) does not include an element of temporal variation of the output voltage of the power supply unit 2. Therefore, in a case where the polarity of the output voltage is switched in the power supply unit 2 in order to switch the polarity of an ion to be measured, when the measurement is performed during the Tb period after the switching, the m/z value calculated using Formula (1) includes the mass deviation as illustrated in FIG. 2.

In contrast, in the TOFMS of the present embodiment, the measurement unit 1 executes measurement at a given timing during the Tb period under an instruction from the control unit 4 to acquire the time-of-flight spectrum data. Then, in the Tb period after the polarity of the output voltage of the power supply unit 2 is switched in order to switch the polarity of an ion to be measured, the m/z value calculator 32 and the m/z value correction unit 33 calculate the m/z value using the following Formula (2) in which a mass deviation amount g (tpn) according to an elapsed time tpn after polarity switching is taken into consideration.

$$m/z=f\ (ttof)\times(1+g\ (tpn)) \tag{2}$$

As described above, the main cause of the mass deviation after the polarity of the voltage is switched is the voltage fluctuation until the voltage applied to the electrode forming the flight space is stabilized. Basically, the ratio of the mass deviation caused by the voltage fluctuation does not depend on the m/z value, and the mass deviation occurs at the same ratio in any m/z value. Therefore, by multiplying f (ttof) by (1+g (tpn)) in consideration of the mass deviation amount according to the elapsed time tpn after polarity switching, it is possible to accurately correct the mass deviation generated until the voltage applied to the electrode after polarity switching is stabilized. g (tpn) is a function indicating a correction coefficient having the elapsed time tpn after polarity switching as a variable.

In addition, Formula (2) is, $$m/z=f\ (ttof)+f\ (ttof)\cdot g\ (tpn)$$

and thus, the following Formula (3) using a mass deviation term G having the elapsed time tpn after polarity switching as a variable is substantially the same.

$$m/z=f\ (ttof)+G\ (tpn) \tag{3}$$

The above-described Formula (2) can be regarded as a function (conversion formula) for obtaining the m/z value including a correction term. On the other hand, Formula (3) means that after the m/z value is calculated without considering the voltage fluctuation, the m/z value is corrected using a correction formula indicating the relationship between the elapsed time tpn after polarity switching and the mass deviation. They are substantially the same.

The relationship between the elapsed time tpn after polarity switching and the mass deviation as illustrated in FIG. 2, that is, the functions g (tpn) and G (tpn) substantially depend on the configuration and structure of the electrical system of the device. Therefore, for example, a manufacturer of the present device checks g (tpn) and G (tpn) by measuring a standard sample in advance at an adjustment stage before shipping the device to a user, and stores them in the correction information storage unit 31. g (tpn) or G (tpn) may be a calculation formula, or may be a data table in which a correction amount or a correction coefficient is output when tpn or an m/z value (or flight time) is input.

The m/z value correction unit 33 receives the information of the elapsed time tpn after polarity switching when the measurement is performed from the control unit 4, and calculates the m/z value in which the mass deviation is corrected for each ion type using the correction information stored in the correction information storage unit 31. The mass spectrum creation unit 34 creates a mass spectrum using the m/z value after mass deviation correction. Thus, a mass spectrum with high mass accuracy can be obtained even when measurement is performed without securing a sufficient waiting time after polarity switching of an ion to be measured.

When the control unit 4 controls the measurement unit 1 so that the measurement is always performed under the same elapsed time tpn after polarity switching (for example, one second after the switching time point), only the mass deviation amount and the correction coefficient corresponding to the elapsed time tpn after polarity switching are stored in the correction information storage unit 31, and the correction can be performed using the information.

In addition, the polarity switching of an ion to be measured includes a case of switching from a positive ion to a negative ion and a case of switching from negative ion to positive ion, and the response characteristics of the power supply unit 2 may be different between a case of switching the voltage from the negative voltage to the positive voltage and a case of switching the voltage from the positive voltage to the negative voltage. Therefore, in such a case where the response characteristics at the time of switching the voltage polarity are different, two types of correction information of positive to negative and negative to positive may be stored in the correction information storage unit 31 and used separately.

[First Modification: Built-In Correction Information Acquisition Function]

Figure 3:
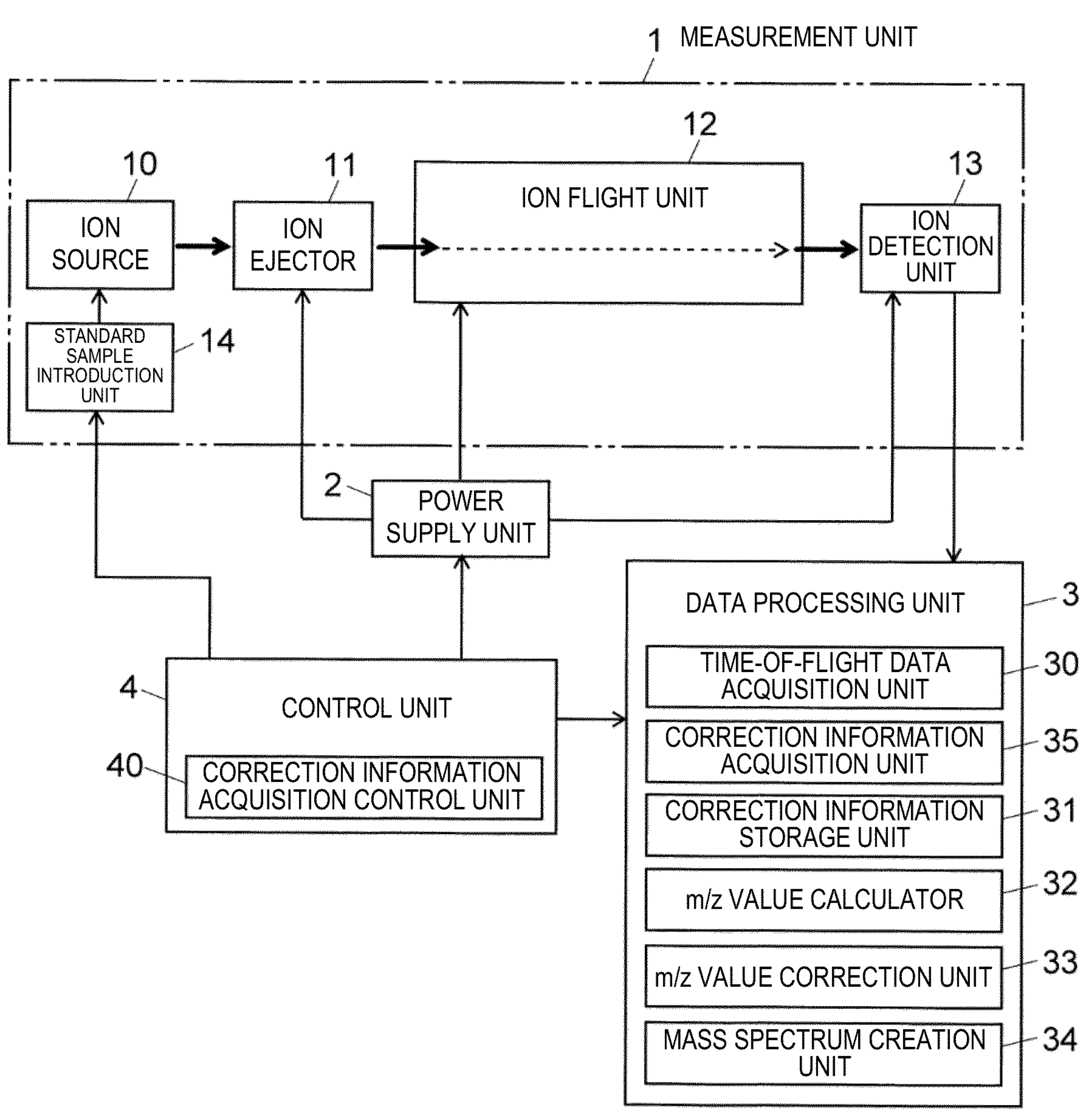
FIG. 3 is a schematic configuration diagram of a TOFMS according to a modification.

FIG. 3 is a schematic configuration diagram of a TOFMS according to a modification of the embodiment. In FIG. 3, the same components as those of the TOFMS illustrated in FIG. 1 are denoted by the same reference signs.

In the TOFMS of the above embodiment, the correction information such as the function g (tpn) in Formula (2) or the function G (tpn) in Formula (3) is stored in advance, specifically, for example, in the correction information storage unit 31 when the present device is provided to the user. In contrast, the TOFMS of this modification has a function of creating or changing the correction information such as functions g (tpn) and G (tpn). That is, the data processing unit 3 includes the correction information acquisition unit 35 as a functional block, and the control unit 4 includes a correction information acquisition control unit 40 as a functional block. In addition, the measurement unit 1 includes a standard sample introduction unit 14 that introduces a standard sample into the ion source 10 separately from a normal sample. The standard sample is a sample containing one or more components whose ideal (or theoretical) m/z value is known.

The response characteristic until the voltage applied from the power supply unit 2 to the electrodes included in the ion flight unit 12 is stabilized varies depending on not only the individual difference of the power supply unit 2, but also the electric resistance or inductance depending on the length or the like of the wiring, the stray capacitance generated by the wiring, or the like. Therefore, although the response characteristics generally depend on the model as described above, there is a certain degree of variation for each device, and when the device is repaired, the response characteristics may change before and after the repair.

In the TOFMS, for example, the user prepares a standard sample for mass deviation measurement designated by a manufacturer in the standard sample introduction unit 14, and instructs the mass deviation measurement from an input unit (not illustrated) by a predetermined operation. Then, in the control unit 4, the correction information acquisition control unit 40 controls the measurement unit 1 to repeatedly execute the measurement on the standard sample after the polarity switching. That is, the standard sample introduction unit 14 supplies the standard sample to the ion source 10, and the ion source 10 ionizes known components in the standard sample. The ion ejector 11, the ion flight unit 12, and the ion detection unit 13 repeatedly acquire time-of-flight spectrum data of ions derived from known components. The correction information acquisition unit 35 obtains a relationship (that is, g (tpn) or G (tpn)) between the elapsed time after the polarity switching and the mass deviation on the basis of the data obtained by the measurement, and stores the relationship in the correction information storage unit 31.

In this way, in the TOFMS, the correction information reflecting the configuration and structure of the device at that time is stored in the correction information storage unit 31. As a result, it is possible to accurately correct the mass deviation in accordance with the configuration and structure of the device, and the mass accuracy of the mass spectrum can be further enhanced.

The above-described work may be performed when a service person of a manufacturer installs the present device at a customer or performs a breakdown repair or maintenance work of the customer, instead of the user himself/herself performing the above-described work of acquiring the correction information. In addition, the operation of acquiring the correction information as described above may be performed as a part of the auto-tuning function for optimizing various parameters in the device without depending on a particular operation or the like by the user.

[Second Modification: Modeling of Function for Correction]

The function g (tpn) indicating the mass deviation described above can be an arbitrary formula, but if the function is modeled and one or more parameters included in the model function are changed, an actually usable function g (tpn) can be obtained, the processing is simple. Specifically, it is possible to model the function as follows.

Figure 6:
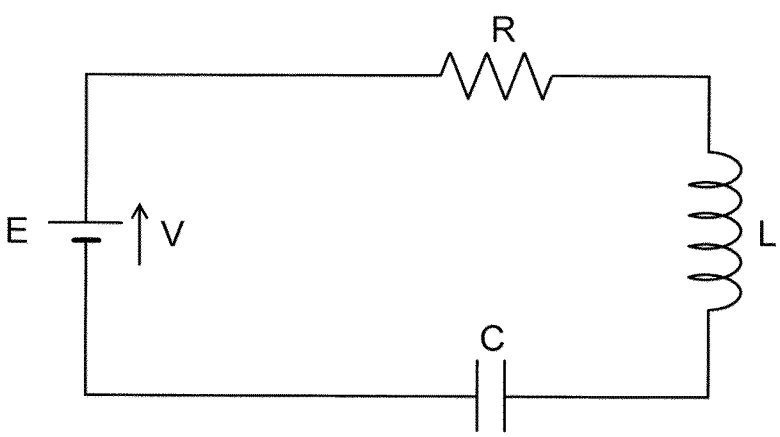
FIG. 6 is a diagram illustrating a simple circuit including electrodes of a power supply unit and a TOF unit.

Although the electric system circuit including the power supply unit 2 used in the TOFMS illustrated in FIG. 1 varies depending on the model of the device, the circuit including the power supply unit 2 and the electrode to which the voltage is applied from the power supply unit 2 can be simply described by an RLC series circuit as illustrated in FIG. 6 in many cases. In FIG. 6, V represents the output voltage of a power supply E, R represents the output resistance, L represents the inductance of the wiring, and C represents the stray capacitance of an electrode or the like.

Assuming that the inductance L of the wiring is negligibly small, the RLC series circuit illustrated in FIG. 6 can be an RC series circuit. In general, in the RC series circuit, a voltage error of $V \cdot e^{-t/RC}$ occurs, and the error decreases as time passes. Therefore, under the assumption that the mass deviation is proportional to the voltage error, the function g (tpn) can be approximated as in Formula (4).

$$g(tpn) = A \cdot e^{-tpn/\tau} \tag{4}$$

The formula (4) may be used as a model function, and the two parameters A and T may be determined according to the configuration and structure of the device.

On the other hand, when the inductance L of the wiring cannot be ignored in FIG. 6, since the circuit is the RLC series circuit, the voltage of the electrode causes damped oscillation. In this case, since the m/z value also causes a mass deviation corresponding to the damped oscillation, the oscillation of the m/z value can be corrected by determining the model function corresponding to the damped oscillation as g (tpn).

Specifically, the model function can be defined as the following Formulas (5) to (7). Since the state of damping varies depending on the values of R, L, and C, it is necessary to select an appropriate model function according to the state of the device at the time by monitoring the mass deviation when the measurement is performed on the standard sample.

$$\text{Under-damping: } g\ (tpn) = A \cdot e^{-(tpn/\tau)} \cos\ (\omega tpn + \alpha) \tag{5}$$

$$\text{Overdamping: } g\ (tpn) = e^{-(tpn/\tau)}(Ae^{\eta tpn} + Be^{-\eta tpn}) \cos\ (\omega tpn + \alpha) \tag{6}$$

$$\text{Critical damping: } g\ (tpn) = (A + Btpn)e^{-(tpn/\tau)} \tag{7}$$

Any one of Formulas (5) to (7) may be used as a model function, and the parameters A, B, τ, ω, α, η, and the like may be appropriately determined according to the configuration and structure of the device.

[Third Modification: Stricter Elapsed Time after Polarity Switching]

As described above, since the mass deviation amount depends on the elapsed time tpn after polarity switching, it is necessary to accurately determine the elapsed time after polarity switching tpn at the time when the measurement is performed in order to accurately correct the mass deviation. In general, when a mass spectrum is calculated by TOFMS, measurement is repeated a plurality of times within a certain event time (data acquisition time), and spectrum data acquired in each of the plurality of times of measurement is integrated (or averaged) in many cases. In a case where the event time is long, the difference between the voltage applied to the electrode at the data acquisition start time point and the voltage applied to the electrode at the data acquisition end time point in the event is large, and the amount of mass deviation at both time points may be different. Therefore, in a case where the event time is long or in a case where more accurate correction is required even if the event time is short, an event time teve may be included in the variable of the mass deviation correction function g as shown in Formula (8).

$$m/z = f\ (ttof) \times (1 + g\ (tpn,\ teve)) \tag{8}$$

This makes it possible to accurately correct the mass deviation even when the event time is long.

Figure 7:
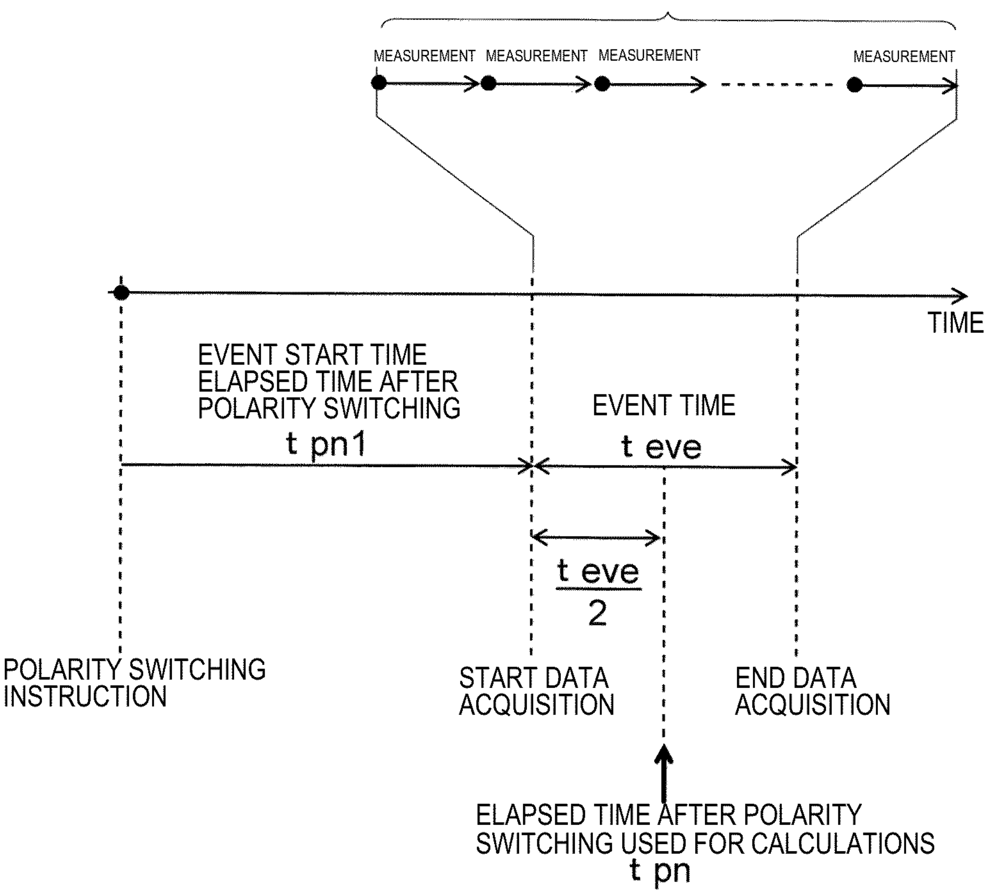
FIG. 7 is an explanatory diagram of an example of processing at the time of correcting a mass deviation.

As an example, as illustrated in FIG. 7, a value obtained by adding ½ of the event time teve to the start time tpn1 of the event can be used as the elapsed time tpn after polarity switching as a variable of the function of the mass deviation amount.

$$g\ (tpn,\ teve) = A \cdot e^{-(tpn1 + teve/2)/\tau} \tag{9}$$

[Fourth Modification: Use of Voltage Monitor Value]

The mass deviation is mainly caused by an error in the voltage applied to the electrode included in the ion flight unit 12. There may be a difference between the output voltage of the power supply unit 2 and the voltage at the electrode due to factors such as electric resistance of the wiring connecting the power supply unit 2 and the electrode. Therefore, in order to correct the mass deviation more accurately, as shown in the following Formula (10), a monitor value Vmon of the voltage (or the corresponding voltage) at the electrode may be included in the variable of the mass deviation correction function g.

$$m/z = f\ (ttof) \times (1 + g\ (tpn,\ Vmon)) \tag{10}$$

Figure 4:
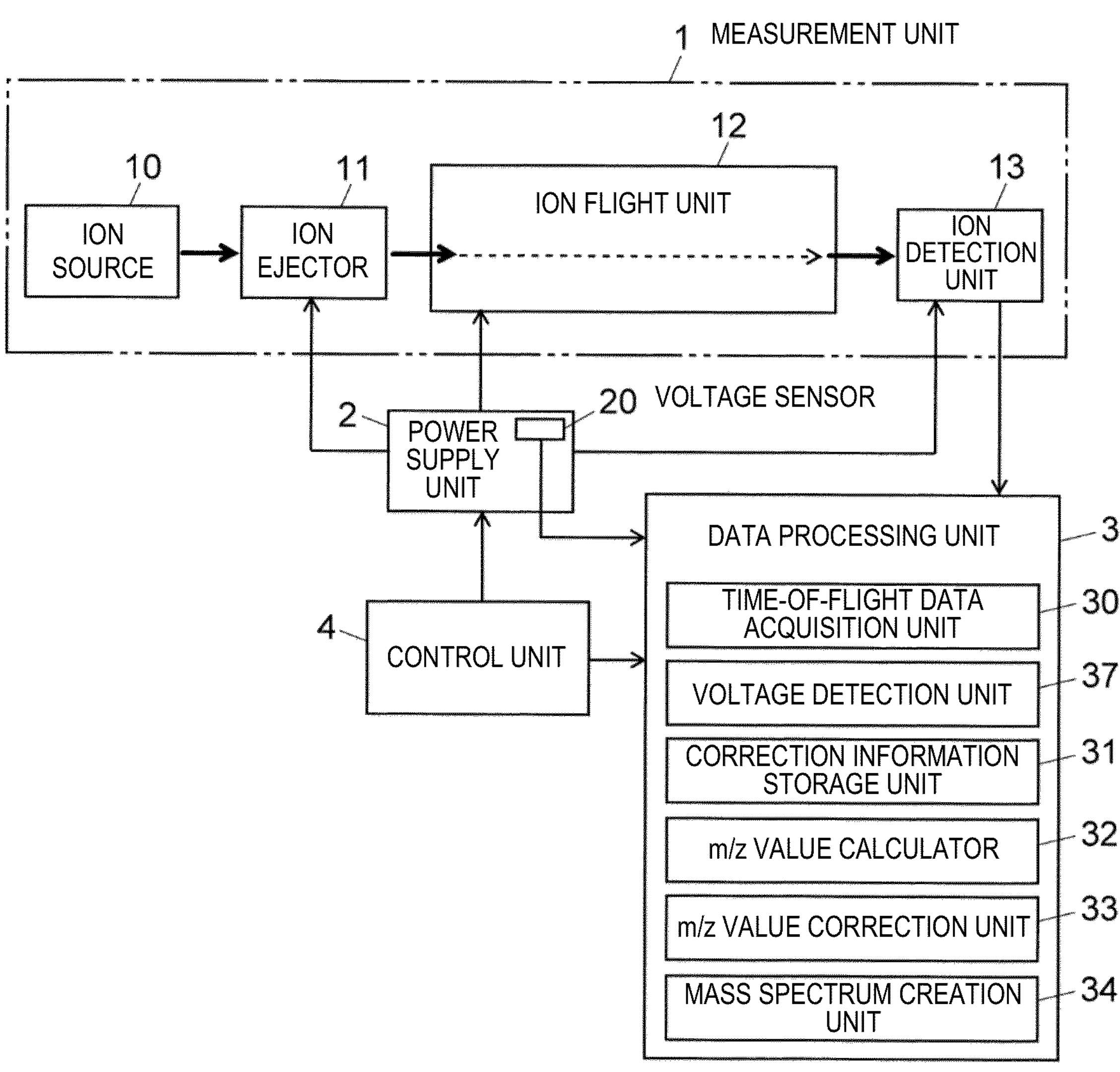
FIG. 4 is a schematic configuration diagram of a TOFMS according to another modification.

FIG. 4 is a schematic configuration diagram of a TOFMS according to this modification. In FIG. 4, the same components as those of the TOFMS illustrated in FIG. 1 are denoted by the same reference signs.

A voltage sensor 20 and a voltage detection unit 37 detect a voltage generated by the power supply unit 2 and applied to one of the electrodes included in the ion flight unit 12. The detected voltage is the monitor value Vmon. The m/z value correction unit 33 obtains a correction amount from the mass deviation correction function g using both the elapsed time tpn after polarity switching and the monitor value Vmon, and corrects the m/z value. As a result, it is possible to perform correction with higher accuracy than in the above embodiment.

An example in which the configuration of the measurement unit 1 is more specifically shown in the TOFMS of the above embodiment will be described below.

First Specific Example: Q-TOFMS

Hereinafter, a quadrupole-time-of-flight (Q-TOF) mass spectrometer as a specific example of the present invention will be described in detail with reference to FIG. 5.

Figure 5:
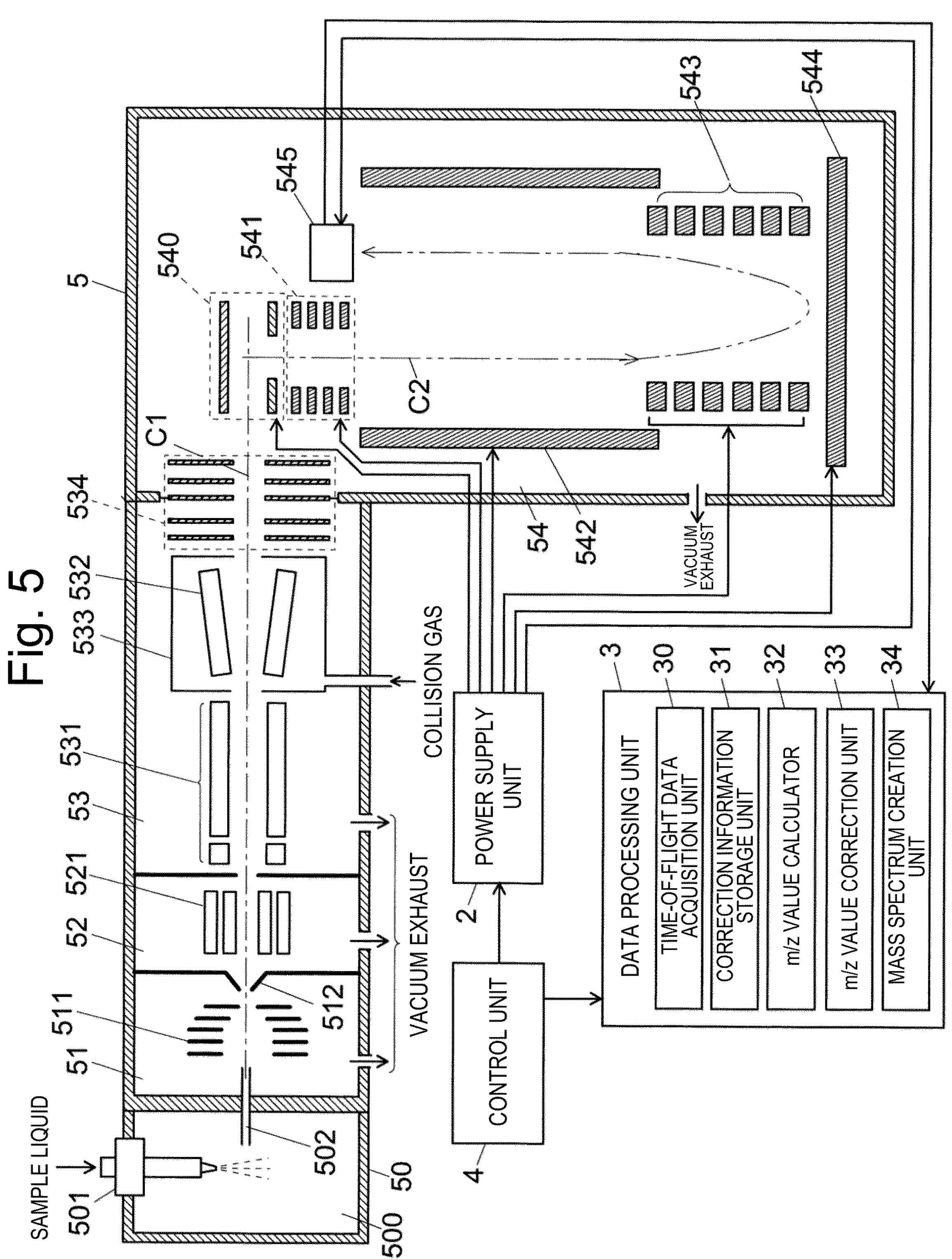
FIG. 5 is an overall configuration diagram when the embodiment of FIG. 1 is applied to a Q-TOFMS.

FIG. 5 is an overall configuration diagram of a specific example in which the above embodiment is applied to a Q-TOF type mass spectrometer. Components other than the measurement unit 1 in FIG. 1 are also illustrated as they are in FIG. 5. The configuration of the measurement unit in the Q-TOF type mass spectrometer is a conventionally known configuration described in Patent Literature 2 or the like, and can be appropriately changed or modified.

In this Q-TOF type mass spectrometer, an ionizer 50 in which an ionization chamber 500 is provided is connected to the front of a vacuum chamber 5. The inside of the vacuum chamber 5 is roughly divided into four chambers of a first intermediate vacuum chamber 51, a second intermediate vacuum chamber 52, a first analysis chamber 53, and a second analysis chamber 54. The ionization chamber 500 has a substantially atmospheric pressure, and has a configuration of a multi-stage differential exhaust system in which the degree of vacuum gradually increases in order from the ionization chamber 500 to the first intermediate vacuum chamber 51, the second intermediate vacuum chamber 52, the first analysis chamber 53, and the second analysis chamber 54. In FIG. 5, a vacuum pump that performs vacuum exhaust in each chamber is not illustrated, but in general, the inside of the first intermediate vacuum chamber 51 is vacuum-exhausted by a rotary pump, and each chamber after that is vacuum-exhausted by a turbo-molecular pump using a rotary pump as a roughening pump.

An electrospray ion (ESI) source 501 that ionizes a compound in a sample liquid by nebulizing the sample liquid while applying a charge to the sample liquid is disposed in the ionization chamber 500. However, the ionization method is not limited to this, and other ion sources such as an atmospheric pressure chemical ion source can also be used. In addition, an ion source that ionizes a gas sample or a solid sample may be used instead of the liquid sample.

The ionization chamber 500 and the first intermediate vacuum chamber 51 communicate with each other through a desolvation tube 502 having a small diameter. Ions and fine charged droplets derived from the sample component generated in the ionization chamber 500 are mainly drawn into the desolvation tube 502 and sent to the first intermediate vacuum chamber 51 by a difference between the pressure (substantially atmospheric pressure) in the ionization chamber 500 and the pressure in the first intermediate vacuum chamber 51. The desolvation tube 502 is heated to an appropriate temperature, and the passage of the charged droplet through the inside of the desolvation tube 502 promotes vaporization of the solvent in the droplet and promotes generation of ions.

A multipole ion guide 511 is disposed in the first intermediate vacuum chamber 51, and ions are converged in the vicinity of an ion optical axis C1 by the ion guide 511, and enter the second intermediate vacuum chamber 52 through the opening at the top of a skimmer 512. A multipole ion guide 521 is also disposed in the second intermediate vacuum chamber 52, and ions are sent from the second intermediate vacuum chamber 52 to the first analysis chamber 53 by the ion guide 521. In the first analysis chamber 53, a quadrupole mass filter 531 that separates ions according to m/z, a collision cell 533 including a multipole ion guide 532 inside, and a part of a transfer electrode 534 that transports ions emitted from the collision cell 533 are disposed.

The ions incident on the first analysis chamber 53 are introduced into the quadrupole mass filter 531, and only ions having a specific m/z according to the voltage applied to the quadrupole mass filter 531 pass through the quadrupole mass filter 531. A collision gas such as argon or nitrogen is continuously or intermittently supplied into the collision cell 533. Ions having predetermined energy and incident on the collision cell 533 come into contact with the collision gas and are dissociated by collision-induced dissociation, and various product ions are generated.

Various product ions emitted from the collision cell 533 are sent to the second analysis chamber 54 while being converged by the transfer electrode 534. In the second analysis chamber 54, an orthogonal acceleration unit 540, an acceleration electrode unit 541, a flight tube 542, a reflectron 543, a back plate 544, an ion detector 545, and the like are disposed. The ions introduced into the second analysis chamber 54 as a thin and highly parallel ion stream by the transfer electrode 534 are ejected in a direction substantially orthogonal to the incident direction of the ion stream in the orthogonal acceleration unit 540.

The ions ejected from the orthogonal acceleration unit 540 in a pulse manner, that is, as a group of ion packets are further accelerated by the acceleration electrode unit 541 and introduced into the flight space in the flight tube 542. The flight tube 542, the reflectron 543, and the back plate 544 form an electric field that causes ions to turn back and fly in a path indicated by C2 in FIG. 5 in the flight space. As a result, the ions fly in the flight tube 542 again after being turned back, and reach the ion detector 545.

The orthogonal acceleration unit 540 and the acceleration electrode unit 541 correspond to electrodes included in the ion ejector 11 in FIG. 1. In addition, the flight tube 542, the reflectron 543, and the back plate 544 correspond to electrodes included in the ion flight unit 12 in FIG. 1. Each of these electrodes forms an electric field necessary for causing ions to fly along the flight path C2, and thus corresponds to a "flight space formation electrode" in the present invention. The power supply unit 2 applies predetermined voltages to the orthogonal acceleration unit 540, the acceleration electrode unit 541, the flight tube 542, the reflectron 543, and the back plate 544. For example, when an ion to be measured is switched from a positive ion to a negative ion, the power supply unit 2 switches the voltage to be applied to each electrode from the negative voltage to the positive voltage according to an instruction from the control unit 4. Although not illustrated in FIG. 5, it is a matter of course that a predetermined voltage is also applied to the ion optical system such as the ion guide and the quadrupole mass filter.

In this Q-TOFMS, the orthogonal acceleration unit 540 repeatedly emits ions in pulses at a predetermined period (for example, 100 usec period). The ejected ions turn back and fly in a flight space formed by voltages applied to the flight tube 542, the reflectron 543, and the back plate 544, and are detected by the ion detector 545. In the data processing unit 3, the time-of-flight data acquisition unit 30 obtains an integrated time-of-flight spectrum on the basis of ionic intensity signals detected in a plurality of measurements performed within a predetermined event time. The m/z value calculator 32 and the m/z value correction unit 33 perform the above-described processing on the flight time of each peak observed on the integrated time-of-flight spectrum. As a result, the m/z value is calculated in which the mass deviation caused by the voltage fluctuation after the polarity switching is corrected. The mass spectrum creation unit 34 creates a mass spectrum using the corrected m/z value.

In a Q-TOF type mass spectrometer equipped with such an atmospheric pressure ion source, in many cases, a liquid chromatograph is connected to a preceding stage, or a liquid sample is introduced into the ion source by a flow injection analysis (FIA) method. Therefore, the time during which a certain component in the sample is introduced into the ion source is limited, but when the component is unknown, it is necessary to perform both the positive ion measurement and the negative ion measurement within the limited time. In the conventional Q-TOFMS, since a waiting time is required for switching between the positive ion measurement and the negative ion measurement, it may be difficult to perform both the positive ion measurement and the negative ion measurement for a certain component. In contrast, in the Q-TOFMS using the present invention, since the waiting time for switching between the positive ion measurement and the negative ion measurement can be shortened to, for example, about one second or less, both the positive ion measurement and the negative ion measurement for a certain component can be performed, and furthermore, a mass spectrum with high mass accuracy can be acquired for each of the positive ion and the negative ion.

Second Specific Example: Multi Turn TOFMS

In order to increase the mass accuracy and the mass resolution in the TOFMS, it is effective to extend the flight distance of ions, and as one method for increasing the mass accuracy and the mass resolution, a multi turn TOFMS is conventionally known. For example, Patent Literature 3 discloses a TOFMS capable of extending a flight distance of ions in a relatively narrow space by causing ions to turn many times along substantially the same orbit. In the TOFMS, the orbit of one turn is substantially elliptical, and the orbit is shifted little by little every time the ion makes one turn on the orbit, so that the number of turns can be increased while avoiding the ion from flying along the same orbit, and a long flight distance can be secured.

Figure 8:
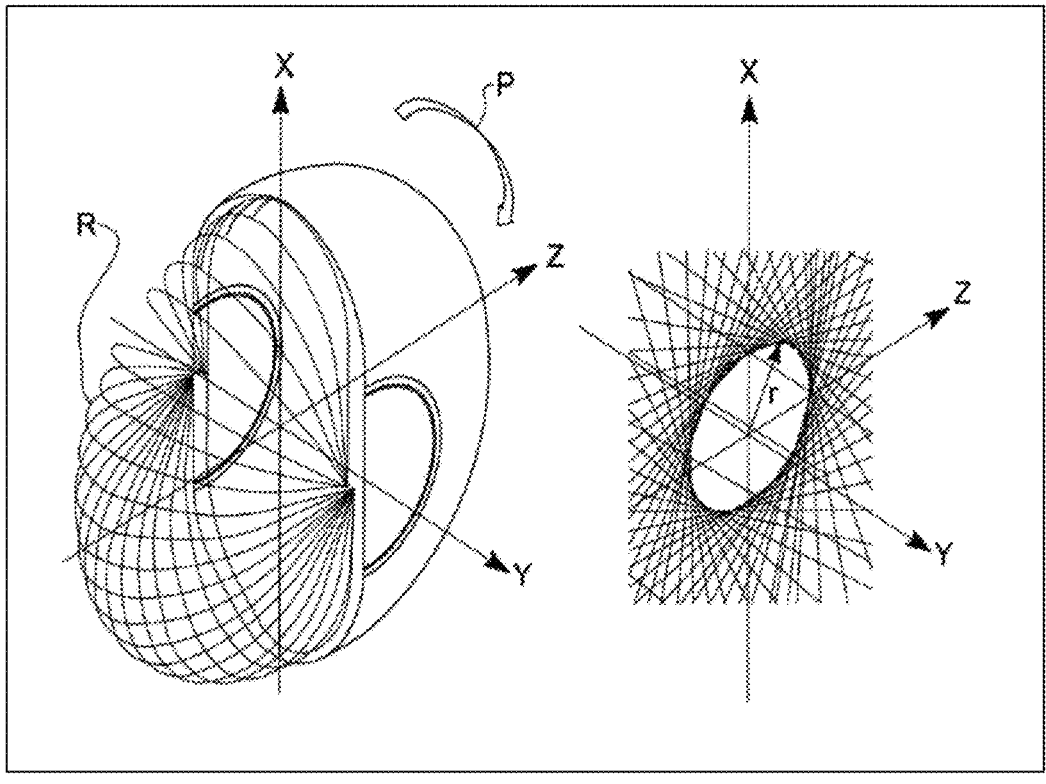
FIG. 8 is a drawing showing an example of a multi-turn orbit, reproduced from FIG. 4B of Patent Literature 3.
Figure 9:
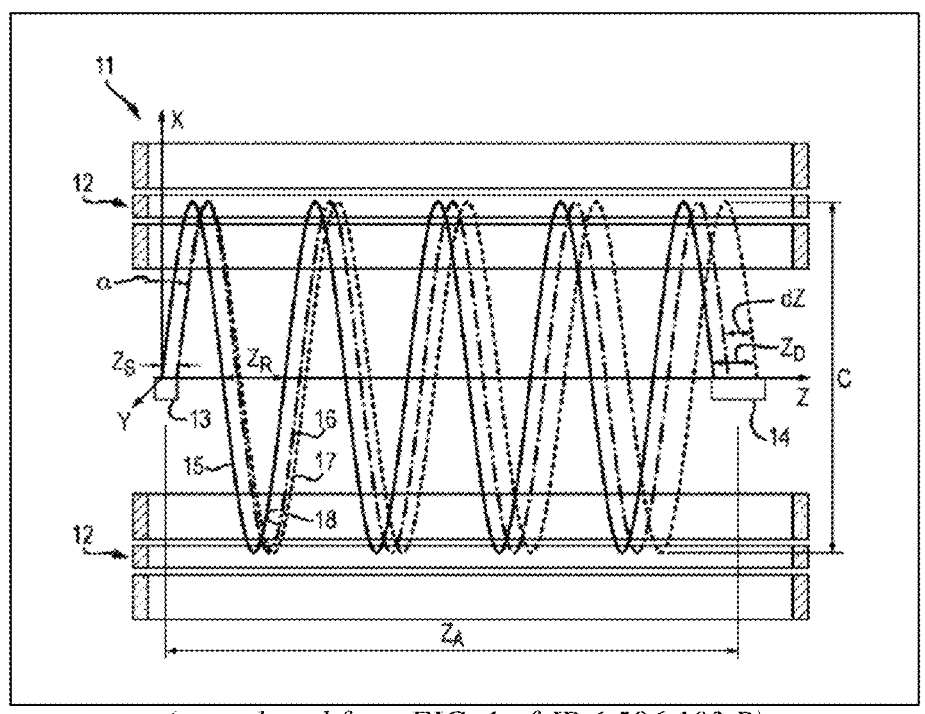
FIG. 9 is a drawing showing an example of a multi-reflection orbit, reproduced from FIG. 1 of Patent Literature 4.

Naturally, the TOFMS of the above embodiments and modifications can also be applied to such a multi turn TOFMS. In the multi turn TOFMS described in Patent Literature 3, in order to cause ions to fly along a predetermined path, a plurality of sector electrodes forming an electric field that guides ions in a curved shape and a plurality of ion lens electrodes forming an electric field that converges ions are used, and these sector electrodes and ion lens electrodes are electrodes included in the ion flight unit 12 in the TOFMS illustrated in FIG. 1 or the like. Therefore, these electrodes correspond to the flight space formation electrodes in the present invention. FIG. 8 shows an example of a multi-turn orbit Third Specific Example: Multi Reflection TOFMS As another method capable of extending the flight distance of ions, a multi reflection TOFMS is conventionally known. For example, Patent Literature 4 discloses a TOFMS capable of extending a flight distance of ions in a relatively narrow space by repeatedly reflecting the ions between a plurality of reflection electrodes. The TOFMS of the above embodiments and modifications can be naturally applied to the multi reflection TOFMS. In the multi reflection TOFMS described in Patent Literature 4, a plurality of flat reflection electrodes disposed substantially in parallel are used to repeatedly fly ions, and such a reflection electrode is an electrode included in the ion flight unit 12 in the TOFMS illustrated in FIG. 1 or the like. Therefore, such an electrode corresponds to the flight space formation electrode in the present invention. FIG. 9 shows an example of a multi-reflection orbit.

In addition, since the present invention is applicable to TOFMS in general, the present invention is also applicable to, for example, ion trap TOFMS, matrix-assisted laser desorption ionization (MALDI)-TOFMS, and the like in addition to Q-TOFMS and the like as described above.

Furthermore, the above-described embodiment, various modifications, and specific examples are merely examples of the present invention, and it is a matter of course that modifications, changes, additions, and the like appropriately made within the scope of the gist of the present invention are included in the claims of the present application.

[Various Modes]

It is understood by those skilled in the art that the exemplary embodiments and modifications described above are specific examples of the following modes.

(Clause 1) A mode of a time-of-flight mass spectrometer according to the present invention includes:

a flight space formation electrode configured to form a flight space for separating ions derived from a component contained in a sample according to a mass-to-charge ratio;

an ion detection unit configured to detect ions that have flown in the flight space;

a voltage switching unit configured to switch a voltage to be applied to the flight space formation electrode from a first voltage for flying ions of a first polarity to a second voltage for flying ions of a second polarity at a given switching timing;

an ion information acquisition unit configured to obtain a time of flight during which the ion flies in the flight space or a mass-to-charge ratio of the ion based on a detection result of the ions of the second polarity obtained by the ion detection unit after the voltage has been switched by the voltage switching unit;

a correction information storage unit configured to store correction information related to a deviation in time of flight or a mass-to-charge ratio associated with an elapsed time from the switching timing; and a correction unit configured to correct the flight time or the mass-to-charge ratio obtained by the ion information acquisition unit according to an elapsed time from the switching timing when the detection result of the ion is obtained using the correction information stored in the correction information storage unit.

(Clause 18) A mode of the time-of-flight mass spectrometry method according to the present invention includes:

a voltage switching step of switching a voltage to be applied to a flight space formation electrode which is configured to form a flight space for separating ions derived from a component contained in a sample according to a mass-to-charge ratio, from a first voltage for flying ions of a first polarity to a second voltage for flying ions of a second polarity at a given switching timing;

an ion information acquisition step of obtaining a time of flight during which the ions fly in the flight space or a mass-to-charge ratio of the ions based on a detection result of the ions of the second polarity obtained by an ion detection unit which is configured to detect ions that have flown in the flight space after the voltage has been switched by the voltage switching step; and a correction step of correcting the flight time or the mass-to-charge ratio obtained in the ion information acquisition step according to an elapsed time from the switching timing when the detection result of the ion is obtained using correction information in which an elapsed time from the switching timing is associated with information on a deviation in the flight time or the mass-to-charge ratio.

With the device according to Clause 1 and the method according to Clause 18, it is possible to shorten the waiting time for measurement after switching the polarity of the ion to be measured while ensuring high mass accuracy. Accordingly, for example, it is possible to perform measurement while switching positive and negative ions at high speed.

With the device according to Clause 1 and the method according to Clause 18, even a power supply having an unsatisfactory response characteristic (rising characteristic of voltage) that has been difficult to adopt so far, for example, a power supply that causes ringing after the voltage approaches the target value, can be adopted as a power supply for applying a voltage to the flight space formation electrode. As a result, it is possible to select an inexpensive power source, and it is possible to reduce the cost of the device.

(Clause 2) In the TOFMS according to Clause 1, the correction information is a correction value corresponding to an elapsed time from the switching timing, and the correction unit may be configured to add the correction value stored in the correction information storage unit to the flight time or the mass-to-charge ratio obtained by the ion information acquisition unit.

(Clause 3) In addition, in the TOFMS according to Clause 1, the correction information is a correction coefficient corresponding to an elapsed time from the switching timing, and the correction unit may be configured to multiply the time of flight or the mass-to-charge ratio obtained by the ion information acquisition unit by a correction coefficient stored in the correction information storage unit.

The "correction value corresponding to an elapsed time from the switching timing" in the TOFMS according to Clause 2, and the "correction coefficient corresponding to an elapsed time from the switching timing" in the TOFMS according to Clause 3 are, for example, a function (calculation formula) in which the elapsed time from the switching timing is a single variable, a data table in which the correction value or the correction coefficient is output with the elapsed time from the switching timing as one input, and the like.

With the TOFMS according to Clause 2 or 3, the time-of-flight or the mass-to-charge ratio can be easily corrected when the elapsed time from the switching timing is given.

(Clause 4) The TOFMS according to any one of Clauses 1 to 3 may further include a correction information acquisition unit which is configured to create or change the correction information.

(Clause 5) The TOFMS according to Clause 4 can further include: an ion source which is configured to generate ions derived from components contained in the sample; and a sample introduction unit which is configured to introduce a known sample into the ion source, and the correction information acquisition unit may be configured to create or change the correction information based on a change in a time-of-flight or a mass-to-charge ratio over time from the switching timing obtained from an intensity signal of ions derived from the known sample.

With the TOFMS according to Clause 4 or 5, it is possible to correct the mass deviation reflecting the response characteristic of the voltage after the polarity switching with high accuracy according to the configuration and structure of the device at that time. Consequently, the mass accuracy of the mass spectrum can be further enhanced. In particular, even in a case where the state of the device changes due to failure repair or part replacement of the device, it is possible to correct the mass deviation with high accuracy.

(Clause 6) In the TOFMS according to Clauses 4 or 5, the correction information acquisition unit may be configured to store a model function corresponding to correction information related to an elapsed time from the switching timing and a deviation in time of flight or a mass-to-charge ratio, and create or change the correction information by changing a parameter value included in the model function.

With the TOFMS according to Clause 6, the correction information can be easily created or changed by relatively simple arithmetic processing.

(Clause 7) In the TOFMS according to Clause 6, the model function includes, as a parameter, a value of at least one of electric resistance, inductance, or capacitance in a simplified circuit connected to a power supply unit that applies a voltage to the flight space formation electrode, and the correction information acquisition unit may be configured to acquire the correction information by changing at least one value of the parameter values included in the model function.

(Clause 8) In the TOFMS according to Clause 7, the model function may be a voltage response function including values of electric resistance and capacitance in a simplified circuit connected to the power supply unit as parameters.

In the TOFMS according to Clause 8, the model function is a simple function in which the mass deviation decreases as time elapses. Therefore, with the TOFMS according to Clause 8, the correction information can be easily determined on the basis of the measurement result of the known sample.

(Clause 9) In the TOFMS according to Clause 7, the model function is a damped response function including at least a value of inductance in a simplified circuit connected to the power supply unit as a parameter, and the correction information acquisition unit may be configured to change the damped response function by changing the value of the inductance to acquire the correction information.

In the TOFMS according to Clause 9, even in a situation where the voltage applied to the flight space formation electrode after the polarity switching reaches the target value while overshooting or ringing, it is possible to satisfactorily correct the mass deviation caused by such voltage fluctuation.

(Clause 10) The TOFMS according to any one of Clauses 1 to 9 further includes, an ion ejector configured to be controlled to perform a measurement event in which an operation of ejecting ions derived from a sample component into the flight space is periodically performed a plurality of times, in which the ion information acquisition unit is configured to obtain a flight time in which the ions fly in the flight space or a mass-to-charge ratio of the ions based on a result of integrating or averaging intensity signals of the ions obtained for each of a plurality of ion emission operations performed in the measurement event, and the correction unit may be configured to correct the flight time or the mass-to-charge ratio obtained by the ion information acquisition unit according to an elapsed time from the switching timing to the start of the measurement event and a predetermined delay time from the start of the measurement event.

(Clause 11) In the TOFMS according to Clause 10, the predetermined delay time may be ½ of a time taken for the measurement event.

In one measurement event, a plurality of measurements are performed, and time-of-flight spectrum data over a predetermined mass-to-charge ratio range is obtained for each measurement, but the voltage applied to the flight space formation electrode may fluctuate even during the execution of the one measurement event. In contrast, with the TOFMS according to Clauses 10 and 11, for example, the flight time and the m/z value are corrected on the basis of the time obtained by adding the elapsed time and the predetermined delay time or the time obtained by the predetermined calculation with the elapsed time and the delay time as variables. According to this, since the correction reflecting the delay time from the start of the measurement event is performed, the mass deviation can be corrected with higher accuracy.

(Clause 12) The TOFMS according to any one of Clauses 1 to 11 further includes, a voltage monitoring unit configured to acquire a monitor voltage corresponding to a voltage applied to at least one of the flight space formation electrodes, in which the correction unit may be configured to correct the flight time or the mass-to-charge ratio obtained by the ion information acquisition unit according to the elapsed time from the switching timing and the monitor voltage.

With the TOFMS according to Clause 12, even when there is a difference between the output voltage from the power supply and the voltage actually applied to the flight space formation electrode, the correction reflecting the difference is performed, so that the mass deviation can be corrected with higher accuracy.

(Clause 13) In the TOFMS according to any one of Clauses 1 to 12, an elapsed time from the switching timing may be less than five seconds.

With the conventional general TOFMS, in order to achieve high mass accuracy, it is necessary to wait at least five seconds or more from the polarity switching of the ion to be measured until the measurement is performed, but with the TOFMS according to Clause 13, it is possible to obtain a mass spectrum with high mass accuracy while shortening this waiting time.

In a mode of the TOFMS according to the present invention, the flight space formation electrode may include various electrodes for forming a flight space for ions to fly along a predetermined path, as follows.

(Clause 14) In the TOFMS according to any one of Clauses 1 to 13, the flight space formation electrode may include a flight tube to which a high voltage with an absolute value of 1 kV or more is applied. The flight tube is usually used in a linear TOFMS or a reflectron TOFMS.

(Clause 15) In the TOFMS according to any one of Clauses 1 to 14, the flight space formation electrode may include a reflectron to which a high voltage with an absolute value of 500 V or more is applied. Reflectron is used in reflectron-type TOFMS.

(Clause 16) In the TOFMS according to any one of Clauses 1 to 13, the flight space formation electrode may include an electrode that forms a multi turn orbit in which ions turn around a plurality of times or a multi reflection orbit in which ions are reflected a plurality of times by an electric field.

(Clause 17) In the TOFMS according to any one of Clauses 1 to 16, the flight space formation electrode may include an ion ejection electrode to which a high voltage having an absolute value of 1 kV or more is applied in a pulsed manner, and which ejects ions of the second polarity toward the flight space by the applied voltage.

For example, in the orthogonal acceleration TOFMS, the ion ejection electrode includes at least one of an expulsion electrode and a retraction electrode in the orthogonal acceleration unit. In the ion trap type TOFMS, the ion ejection electrode is an electrode constituting an ion trap, and in the three-dimensional quadrupole type ion trap, the electrode is an end cap electrode. In addition, in the linear type ion trap, a rod electrode in which an ion ejection port is formed and a rod electrode disposed to face the rod electrode with an ion optical axis interposed between them are used. In addition, in MALDI-TOFMS, the ion ejection electrode includes an acceleration electrode that accelerates the extracted ions.

REFERENCE SIGNS LIST

1 . . . Measurement Unit
10 . . . Ion Source
11 . . . Ion Ejector
12 . . . Ion Flight Unit
13 . . . Ion Detection Unit
14 . . . Standard Sample Introduction Unit
2 . . . Power Supply Unit
20 . . . Voltage Sensor
3 . . . Data Processing Unit
30 . . . Time-of-Flight Data Acquisition Unit
31 . . . Correction Information Storage Unit
32 . . . m/z Value Calculator
33 . . . m/z Value Correction Unit
34 . . . Mass Spectrum Creation Unit
35 . . . Correction Information Acquisition Unit
37 . . . Voltage Detection Unit
4 . . . Control Unit
40 . . . Correction Information Acquisition Control Unit
5 . . . Vacuum Chamber
50 . . . Ionizer
500 . . . Ionization Chamber
501 . . . ESI Source
502 . . . Desolvation Tube
51 . . . First Intermediate Vacuum Chamber
511, 521, 532 . . . Ion Guide
512 . . . Skimmer
52 . . . Second Intermediate Vacuum Chamber
53 . . . First Analysis Chamber
531 . . . Quadrupole Mass Filter
533 . . . Collision Cell
534 . . . Transfer Electrode
54 . . . Second Analysis Chamber
540 . . . Orthogonal Acceleration Unit
541 . . . Acceleration Electrode Unit
542 . . . Flight Tube
543 . . . Reflectron
544 . . . Back Plate
545 . . . Ion Detector

The invention claimed is:

1. A time-of-flight mass spectrometer comprising:

a flight space formation electrode configured to form a flight space for separating ions derived from a component contained in a sample according to a mass-to-charge ratio;

an ion detection unit configured to detect ions that have flown in the flight space;

a voltage switching unit configured to switch a voltage to be applied to the flight space formation electrode from a first voltage for flying ions of a first polarity to a second voltage for flying ions of a second polarity at a given switching timing;

an ion information acquisition unit configured to obtain a time of flight during which the ion flies in the flight space or a mass-to-charge ratio of the ion based on a detection result of the ions of the second polarity obtained by the ion detection unit after the voltage has been switched by the voltage switching unit;

a correction information storage unit configured to store correction information related to a deviation in time of flight or a mass-to-charge ratio associated with an elapsed time from the switching timing; and a correction unit configured to correct the time of flight or the mass-to-charge ratio obtained by the ion information acquisition unit according to an elapsed time from the switching timing when the detection result of the ion is obtained using the correction information stored in the correction information storage unit.

2. The time-of-flight mass spectrometer according to claim 1, wherein the correction information is a correction value corresponding to an elapsed time from the switching timing, and the correction unit is configured to add the correction value stored in the correction information storage unit to the time of flight or the mass-to-charge ratio obtained by the ion information acquisition unit.

3. The time-of-flight mass spectrometer according to claim 1, wherein the correction information is a correction coefficient corresponding to an elapsed time from the switching timing, and the correction unit is configured to multiply the time of flight or the mass-to-charge ratio obtained by the ion information acquisition unit by a correction coefficient stored in the correction information storage unit.

4. The time-of-flight mass spectrometer according to claim 1, further comprising a correction information acquisition unit which is configured to create or change the correction information.

5. The time-of-flight mass spectrometer according to claim 4 further comprising an ion source which is configured to generate ions derived from components contained in the sample; and a sample introduction unit which is configured to introduce a known sample into the ion source, wherein the correction information acquisition unit is configured to create or change the correction information based on a change in a time-of-flight or a mass-to-charge ratio over time from the switching timing obtained from an intensity signal of ions derived from the known sample.

6. The time-of-flight mass spectrometer according to claim 4, wherein the correction information acquisition unit is configured to store a model function corresponding to correction information related to an elapsed time from the switching timing and a deviation in time of flight or a mass-to-charge ratio, and create or change the correction information by changing a parameter value included in the model function.

7. The time-of-flight mass spectrometer according to claim 6, wherein the model function includes, as a parameter, a value of at least one of electric resistance, inductance, or capacitance in a simplified circuit connected to a power supply unit that applies a voltage to the flight space formation electrode, and the correction information acquisition unit is configured to acquire the correction information by changing at least one value of the parameter values included in the model function.

8. The time-of-flight mass spectrometer according to claim 7, wherein the model function is a voltage response function including values of electric resistance and capacitance in a simplified circuit connected to the power supply unit as parameters.

9. The time-of-flight mass spectrometer according to claim 7, wherein the model function is a damped response function including at least a value of inductance in a simplified circuit connected to the power supply unit as a parameter, and the correction information acquisition unit is configured to change the damped response function by changing the value of the inductance to acquire the correction information.

10. The time-of-flight mass spectrometer according to claim 1 further comprising, an ion ejector configured to be controlled to perform a measurement event in which an operation of ejecting ions derived from a sample component into the flight space is periodically performed a plurality of times, wherein the ion information acquisition unit is configured to obtain a time of flight in which the ions fly in the flight space or a mass-to-charge ratio of the ions based on a result of integrating or averaging intensity signals of the ions obtained for each of a plurality of ion emission operations performed in the measurement event, and the correction unit is configured to correct the time of flight or the mass-to-charge ratio obtained by the ion information acquisition unit according to an elapsed time from the switching timing to the start of the measurement event and a predetermined delay time from the start of the measurement event.

11. The time-of-flight mass spectrometer according to claim 10, wherein the predetermined delay time is ½ of a time taken for the measurement event.

12. The time-of-flight mass spectrometer according to claim 1 further comprising a voltage monitoring unit configured to acquire a monitor voltage corresponding to a voltage applied to the flight space formation electrode, wherein the correction unit is configured to correct the time of flight or the mass-to-charge ratio obtained by the ion information acquisition unit according to an elapsed time from the switching timing and the monitor voltage.

13. The time-of-flight mass spectrometer according to claim 1, wherein an elapsed time from the switching timing is less than five seconds.

14. The time-of-flight mass spectrometer according to claim 1, wherein the flight space formation electrode includes a flight tube to which a high voltage with an absolute value of 1 kV or more is applied.

15. The time-of-flight mass spectrometer according to claim 1, wherein the flight space formation electrode includes a reflectron to which a high voltage with an absolute value of 500 V or more is applied.

16. The time-of-flight mass spectrometer according to claim 1, wherein the flight space formation electrode includes an electrode that forms a multi turn orbit in which ions turn around a plurality of times or a multi reflection orbit in which ions are reflected a plurality of times by an electric field.

17. The time-of-flight mass spectrometer according to claim 1, wherein the flight space formation electrode included an ion ejection electrode to which a high voltage having an absolute value of 1 kV or more is applied in a pulsed manner, and which ejects ions of the second polarity toward the flight space by the applied voltage.

18. A time-of-flight mass spectrometry method comprising:

a voltage switching step of switching a voltage to be applied to a flight space formation electrode which is configured to form a flight space for separating ions derived from a component contained in a sample according to a mass-to-charge ratio, from a first voltage for flying ions of a first polarity to a second voltage for flying ions of a second polarity at a given switching timing;

an ion information acquisition step of obtaining a time of flight during which the ions fly in the flight space or a mass-to-charge ratio of the ions based on a detection result of the ions of the second polarity obtained by an ion detection unit which is configured to detect ions that have flown in the flight space after the voltage has been switched by the voltage switching step; and a correction step of correcting the time of flight or the mass-to-charge ratio obtained in the ion information acquisition step according to an elapsed time from the switching timing when the detection result of the ion is obtained using correction information in which an elapsed time from the switching timing is associated with information on a deviation in the time of flight or the mass-to-charge ratio.

* * * * *